United States Patent
Kim

(10) Patent No.: US 9,361,831 B2
(45) Date of Patent: Jun. 7, 2016

(54) DISPLAY DEVICE AND METHOD FOR MANUFACTURING THE SAME

(71) Applicant: SAMSUNG DISPLAY CO., LTD., Yongin, Gyeonggi-Do (KR)

(72) Inventor: Dong Gyu Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/295,192

(22) Filed: Jun. 3, 2014

(65) Prior Publication Data

US 2015/0255017 A1 Sep. 10, 2015

(30) Foreign Application Priority Data

Mar. 5, 2014 (KR) .................. 10-2014-0026100

(51) Int. Cl.
*G09G 3/30* (2006.01)
*G09G 3/32* (2016.01)
*H01L 27/32* (2006.01)

(52) U.S. Cl.
CPC ............ *G09G 3/3258* (2013.01); *G09G 3/3225* (2013.01); *H01L 27/3276* (2013.01); *G09G 2300/0404* (2013.01); *G09G 2300/0426* (2013.01); *G09G 2300/0452* (2013.01); *G09G 2300/08* (2013.01); *G09G 2320/0233* (2013.01)

(58) Field of Classification Search
CPC ......... G09G 3/30; G09G 3/32; G09G 3/3208; G09G 3/3216; G09G 3/3225; G09G 3/3233; G09G 3/3241; G09G 3/325; G09G 3/3258; G09G 3/3266; G09G 3/3275; G09G 3/3283; G09G 3/3291; G09G 2300/0421; G09G 2300/0426; G09G 2300/043
USPC ............................................. 345/76
See application file for complete search history.

(56) References Cited

U.S. PATENT DOCUMENTS

2004/0155574 A1* 8/2004 Lai et al. ............... 313/504
2008/0165302 A1* 7/2008 Yasui et al. .............. 349/48

FOREIGN PATENT DOCUMENTS

| KR | 10-2005-0022993 A | 3/2005 |
| KR | 10-2011-0131973 A | 12/2011 |
| KR | 10-2012-0019016 A | 3/2012 |
| KR | 10-2012-0062494 A | 6/2012 |

* cited by examiner

*Primary Examiner* — Gustavo Polo
(74) *Attorney, Agent, or Firm* — Lewis Roca Rothgerber Christie LLP

(57) ABSTRACT

A display device including a substrate having a display region on which an image is configured to be displayed, a plurality of pixels on the display region of the substrate, and a plurality of common power lines on the display region of the substrate and configured to supply a common power voltage to the plurality of pixels, the plurality of common power lines including first and second common power lines extending in a first direction, the second common power line being connected to the plurality of pixels arranged along the first direction, and the first and second common power lines being connected to each other in a central portion of the display region.

20 Claims, 26 Drawing Sheets

DISPLAY DEVICE AND METHOD FOR MANUFACTURING THE SAME

CROSS-REFERENCE TO RELATED APPLICATIONS

This application claims priority to and the benefit of Korean Patent Application No. 10-2014-0026100, filed on Mar. 5, 2014 in the Korean Intellectual Property Office, the disclosure of which is incorporated herein in its entirety by reference.

BACKGROUND

1. Field

The present invention relates to a display device.

2. Description of the Prior Art

A display device is a device that visually displays data. The display device may be a liquid crystal display, an electrophoretic display, an organic light emitting display, an inorganic EL (Electro Luminescent) display, a field emission display, a surface-conduction electron-emitter display, a plasma display, or a cathode ray display.

Among them, the organic light emitting display is a display device that displays information, such as an image or text, using light that is generated through combination of holes and electrons, which are respectively provided from an anode electrode and a cathode electrode, in an organic layer that is positioned or located between the anode electrode and the cathode electrode.

Recently, a digital driving method, e.g., a constant voltage driving method, has been adopted for use with organic light emitting displays. The digital driving method enables the organic light emitting display to smoothly implement a high-resolution image using a simple Integrated Circuit (IC) structure. Further, because the digital driving method is a driving method that uses an on/off state of a driving thing film transistor (TFT), it is scarcely affected by the picture quality deterioration phenomenon due to the deviation (or variations) of TFT characteristics in a panel, and thus it is suitable for implementing a large-size panel.

However, the organic light emitting display adopting or utilizing a digital driving method may exhibit an IR-drop phenomenon, and if a voltage that is applied to a pixel is decreased, current that flows thereto may abruptly decrease. For example, if a voltage that is applied to a green pixel is decreased from 6V to 5V, the current that flows through the green pixel is decreased by about 60%.

The current decrease due to the IR-drop phenomenon may cause a difference in luminance between positions of a display region on which an image is displayed. Recently, with large-sized organic light emitting displays, the luminance difference between the positions of the display region has been further increased.

SUMMARY

Accordingly, aspects of embodiments of the present invention have been made to provide a display device which can reduce or minimize a difference in luminance between positions of a display region on which an image is displayed.

Another aspect of embodiments of the present invention provides a method for manufacturing a display device which can reduce or minimize a difference in luminance between positions of a display region on which an image is displayed.

Additional aspects of embodiments of the invention will be set forth in part in the description which follows and in part will become apparent to those having ordinary skill in the art upon examination of the following or may be learned from practice of the invention.

In one aspect of embodiments of the present invention, a display device includes a substrate having a display region on which an image is configured to be displayed, a plurality of pixels on the display region of the substrate, and a plurality of common power lines on the display region of the substrate and configured to supply a common power voltage to the plurality of pixels, the plurality of common power lines including first and second common power lines extending along a first direction, the second common power line being connected to the plurality of pixels arranged along the first direction, and the first and second common power lines being connected to each other in a central portion of the display region.

The common power voltage may be supplied from both end portions of the first common power line.

The plurality of pixels may be in a matrix form, and the first and second common power lines may extend in a row or column direction of the matrix.

Each of the plurality of pixels may include a first electrode, an organic light emitting layer, and a second electrode, which are successively laminated, and the second common power line may contact the second electrode.

The display device may further include a thin film transistor including a drain electrode, the drain electrode being connected to the first electrode, and an insulating layer between the first electrode and the drain electrode, wherein the first common power line may be on the same plane as the drain electrode, and the second common power line may be on the same plane as the first electrode.

The first and second common power lines may overlap.

The first and second common power lines may be on the same plane as the first electrode.

The display device may further include a connection line connecting the first and second common power lines to each other, wherein the connection line may be on a virtual line that interconnects center points of the first and second common power lines to each other.

The display device may further include a plurality of connection lines interconnecting the first and second common power lines to each other, wherein the plurality of connection lines may be symmetrically located about a virtual line that connects center points of the first and second common power lines.

The plurality of pixels may include first, second, and third pixels that are configured to emit light of different colors.

The display device may further include a plurality of pixel power lines on the display region of the substrate, the plurality of pixel power lines being configured to supply first, second, and third pixel power voltages to the plurality of pixels, the first, second, and third pixel power voltages being different from the common power voltage wherein the first pixel power line may supply the first pixel power voltage to the first pixel, the first pixel power line may supply the second pixel power voltage to the second pixel, and the third pixel power line may supply the third pixel power voltage to the third pixel.

The first pixel power voltage may be supplied from both end portions of the first pixel power line, the second pixel power voltage may be supplied from both end portions of the second pixel power line, and the third pixel power voltage may be supplied from both end portions of the third pixel power line.

Resistances of the plurality of common power lines may be smaller than resistances of the plurality of pixel power lines.

The first, second, and third pixels may be configured to emit red light, green light, and blue light, a resistance of the first pixel power line may be larger than a resistance of the second pixel power line, and a resistance of the second pixel power line may be larger than a resistance of the third pixel power line.

In another aspect of an embodiment of the present invention, a display device includes a substrate having a display region in which an image is configured to be displayed, a plurality of pixels on the display region of the substrate, and a plurality of common power lines on the display region of the substrate and configured to supply a common power voltage to the plurality of pixels, the plurality of common power lines including first and second common power lines that are adjacent to each other, wherein a voltage of the first common power line may increase along a direction from an edge portion of the display region toward a central portion of the display region, and wherein a voltage of the second common power line may decrease along the direction from the edge portion of the display region toward the central portion of the display region.

The display device may further include a plurality of pixel power lines on the display region of the substrate, the plurality of pixel power lines being configured to supply a plurality of pixel power voltages to the plurality of pixels, the plurality of pixel power voltages being different from the common power voltage, wherein the plurality of pixel power lines may include at least one pixel power line coupled to a pixel of the plurality of pixels, the pixel being coupled to the first and second common power lines, and wherein a voltage difference between the at least one pixel power line and the second common power line may be substantially constant in the display region.

The common power voltage may be supplied from both end portions of the first common power line, and wherein the pixel power voltage may be supplied from both end portions of the at least one pixel power line.

In still another aspect of an embodiment of the present invention, a method for manufacturing a display device includes forming a first common power line on a substrate, forming a planarization layer that exposes a central portion of the first common power line, and forming a second common power line on the planarization layer, the second common power line overlapping a first electrode and the first common power line.

The method may further include forming an organic light emitting layer on the first electrode after forming the first electrode and the second common power line; and forming a second electrode on the organic light emitting layer.

The second electrode may directly contact the second common power line.

According to embodiments of the present invention, at least the following effects can be achieved.

For example, the difference in luminance between the positions of the display region on which the image is displayed can be reduced or minimized.

The effects according to the present invention are not limited to the contents as exemplified above, but more various effects are described in the specification of the present invention.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Figure 1:
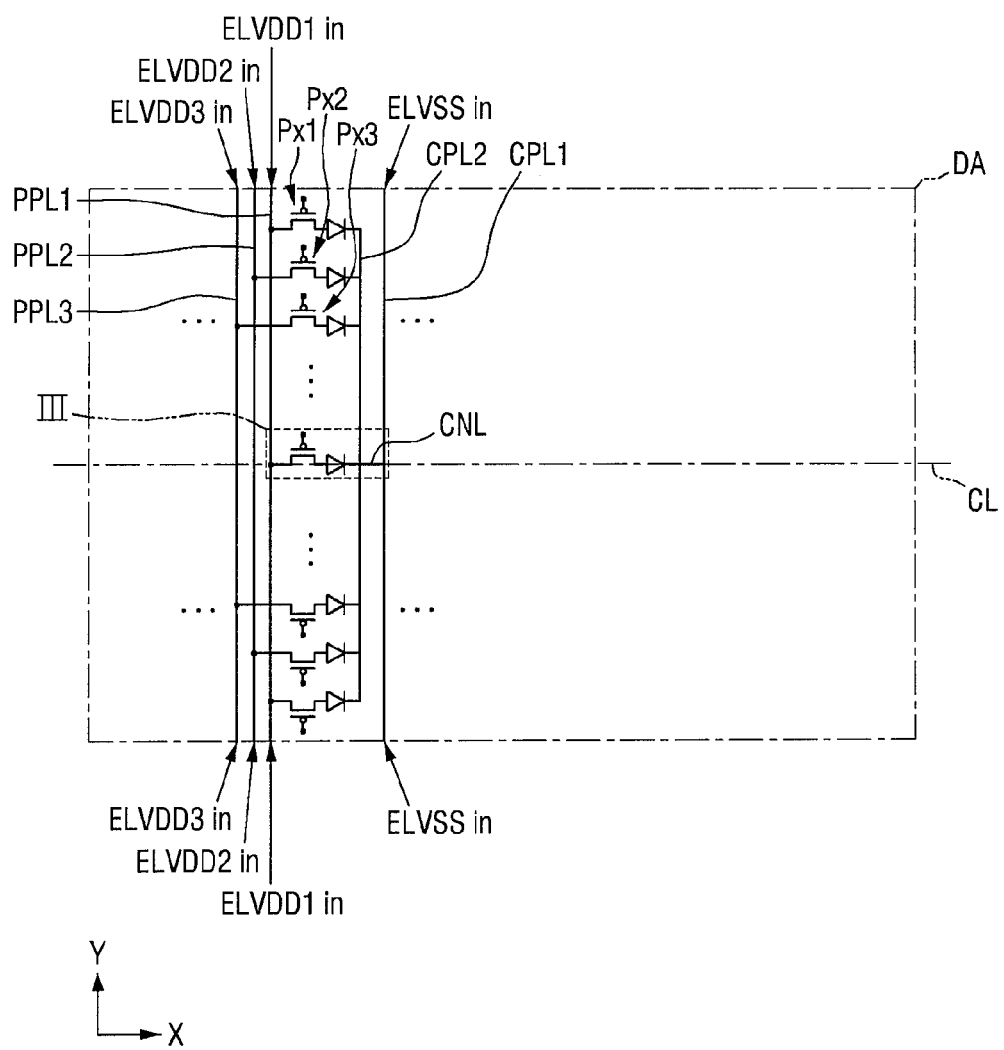
FIG. 1 is a schematic plan view of a display device according to an embodiment of the present invention.

Aspects and features of the present invention and methods of accomplishing the same may be understood more readily by reference to the following detailed description of embodiments and the accompanying drawings. Embodiments of the present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

A display device is a device that displays an image, and may be a liquid crystal display, an electrophoretic display, an organic light emitting display, an inorganic EL (Electro Luminescent) display, a field emission display, a surface-conduction electron-emitter display, a plasma display, or a cathode ray display.

Hereinafter, as a display device according to an embodiment of the present invention, an organic light emitting display is described. However, display devices according to embodiments of the present invention are not limited thereto, and various types of display devices may be used.

Hereinafter, embodiments of the present invention will be described in more detail with reference to the accompanying drawings.

FIG. 1 is a schematic plan view of a display device according to an embodiment of the present invention. Referring to FIG. 1, a display device according to an embodiment of the present invention includes a plurality of pixels Px1, Px2, and Px3 positioned or located in a display region DA, a plurality of pixel power lines PPL1, PPL2, and PPL3, and a plurality of common power lines CPL1 and CPL2.

The display region DA may be a region in which an image is displayed. In one embodiment, the display region DA is formed in a center (or central) region (or portion) of a substrate 100 (see FIG. 4) to be described later. In the description of embodiments of the present invention, a display region DA having a rectangular shape is described, but embodiments of the present invention are not limited thereto. For example, the display region DA may have a circular shape or an elliptical shape.

The plurality of pixels Px1, Px2, and Px3 may be arranged in the form of a matrix in the display region DA. In one embodiment, the plurality of pixels PX1, Px2, and Px3 includes the first pixel Px1, the second pixel Px2, and the third pixel Px3 that emit light having different colors. Here, for example, the first pixel Px1 may emit red light, the second pixel Px2 may emit green light, and the third pixel Px3 may emit blue light, but embodiments of the present invention are not limited thereto. The first pixel Px1, the second pixel Px2, and the third pixel Px3 may be arranged to repeat along a column direction of the matrix. In other words, the first pixel Px1, the second pixel Px2, and the third pixel Px3 may form a pixel set, and such a pixel set may be arranged in a line along the y direction of FIG. 1. However, the pixel arrangement of embodiments of the present invention is not limited thereto, and only the first pixel Px1, the second pixel Px2, or the third pixel Px3 may be arranged in one column (e.g., in one embodiment, a single column includes only pixels configured to emit the same color light).

The plurality of pixel power lines PPL1, PPL2, and PPL3 may be formed to extend in the column direction of the matrix in the display region DA. For example, the plurality of pixel power lines PPL1, PPL2, and PPL3 may be arranged in parallel to each other. In one embodiment, the plurality of pixel power lines PPL1, PPL2, and PPL3 includes the first pixel power line PPL1, the second pixel power line PPL2, and the third pixel power line PPL3. Here, the first pixel power line PPL1 may be connected to the first pixel Px1, the second pixel power line PPL2 may be connected to the second pixel Px2, and the third pixel power line PPL3 may be connected to the third pixel Px3. Further, the first pixel power line PPL1 may supply a first pixel power voltage ELVDD1 to the first pixel Px1, the second pixel power line PPL2 may supply a second pixel power voltage EVLDD2 to the second pixel Px2, and the third pixel power line PPL3 may supply a third pixel power voltage EVLDD3 to the third pixel Px3. In this case, the first pixel power voltage ELVDD1 may be supplied from both end portions of the first pixel power line PPL1, the second pixel power voltage ELVDD2 may be supplied from both end portions of the second pixel power line PPL2, and the third pixel power voltage ELVDD3 may be supplied from both end portions of the third pixel power line PPL3. Here, both end portions of the first pixel power line PPL1, the second pixel power line PPL2, and the third pixel power line PPL3 may come in contact with upper and lower edges of the display region DA.

If the first pixel power voltage ELVDD1, the second pixel power voltage ELVDD2, and the third pixel power voltage ELVDD3 are supplied only from the end portions of the first pixel power line PPL1, the second pixel power line PPL2, and the third pixel power line PPL3, for example, from the upper portion of the display region DA, the luminance of the upper portion of the display region DA may be different from the luminance of the lower portion of the display region DA due to voltage drop phenomenon according to IR drop along the lengths of the pixel power lines. In particular, such luminance imbalance phenomenon may be intensified in a large-sized display device. In order to reduce or prevent the occurrence of such phenomenon, the first pixel power voltage ELVDD1, the second pixel power voltage ELVDD2, and the third pixel power voltage ELVDD3 may be applied to both end portions of the first pixel power line PPL1, the second pixel power line PPL2, and the third pixel power line PPL3 to reduce a difference in luminance between the upper and lower portions of the display region DA.

The plurality of common power lines CPL1 and CPL2 may be formed to extend in the column direction of the matrix in the display region DA. For example, the plurality of common power lines CPL1 and CPL2 may be arranged in parallel to each other. In one embodiment, the plurality of common power lines CPL1 and CPL2 includes the first common power line CPL1 and the second common power line CPL2. Here, the second common power line CPL2 may be connected to the plurality of pixels Px1, Px2, and Px3 that are arranged along the column direction of the matrix. Further, the first common power line CPL1 may be connected to the second common power line CPL2 in or near the center (or central) portion of the display region DA. In more detail, in one embodiment, the first common power line CPL1 and the second common power line CPL2 may be electrically connected to each other across a virtual (or imaginary) line that divides the display region DA into upper and lower equal parts, for example, across a connection line CNL positioned or located on the center line CL. In other words, the connection line CNL may be positioned or located on the virtual line that connects (or interconnects) the respective center points of the first common power line CPL1 and the second command power line CPL2. On the other hand, a common power voltage ELVSS which is lower than the first pixel power voltage ELVDD1, the second pixel power voltage ELVDD2, and the third pixel power voltage ELVDD3, for example, a ground voltage, may be applied to both end portions of the first common power line CPL1. Here, the both end portions of the first common power line CPL1 may come in contact with upper and lower edges of the display region DA.

As described above, because the common power voltage ELVSS is not applied to the second common power line CPL2 that is directly connected to the plurality of pixels Px1, Px2, and Px3, but is supplied from the two (or both) end portions of the first common power line CPL1 that is indirectly connected to the plurality of pixels Px1, Px2, and Px3 (e.g., through connection line CNL and second common power line CPL2), the difference in luminance between the positions of the display region DA can be decreased. This feature will be described in more detail later.

Figure 2:
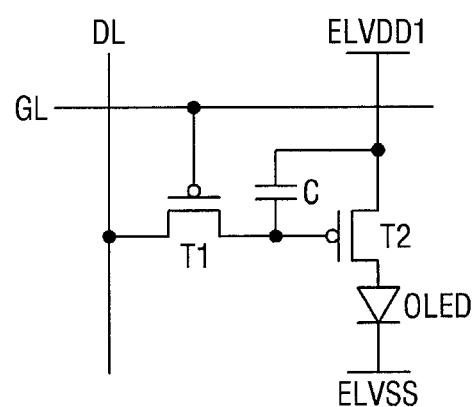
FIG. 2 is an equivalent circuit diagram of a first pixel of the display device of FIG. 1.

Before the detailed plan view and cross-sectional views of the display device according to an embodiment of the present invention are described, an equivalent circuit diagram of one of the plurality of pixels Px1, Px2, and Px3 will be described. FIG. 2 is an equivalent circuit diagram of the first pixel Px1 of the display device of FIG. 1 according to one embodiment of the present invention. Because the equivalent circuit diagrams of the second pixel Px2 and the third pixel Px3 are substantially the same as the equivalent circuit diagram of the first pixel Px1, the detailed description thereof will be omitted.

Referring to FIG. 2, the first pixel Px1 includes an organic light emitting diode OLED and a pixel circuit for controlling the organic light emitting diode OLED. The pixel circuit includes a first thin film transistor T1, a second thin film transistor T2, and a holding capacitor C.

The first thin film transistor T1 may be a switching transistor. The first thin film transistor T1 includes a gate electrode that is connected to a gate line GL, one end that is connected to a data line DL, and another end that is connected to a gate electrode of the second thin film transistor T2.

The second thin film transistor T2 may be a driving transistor. The second thin film transistor T2 includes a gate electrode that is connected to the other end of the first thin film transistor T1, one end that is connected to the first pixel power line PPL1 to which the first pixel power voltage ELVDD1 is applied, and another end that is connected to an anode electrode of the organic light emitting diode OLED.

The holding capacitor C includes one end that is connected to the gate electrode of the second thin film transistor T2 and another end that is connected to the first pixel power line PPL1. The holding capacitor C is charged with a data voltage that is applied to the gate electrode of the second thin film transistor T2 through the first thin film transistor T1 and holds the data voltage even after the first thin film transistor T1 is turned off.

The organic light emitting diode OLED includes an anode electrode that is connected to the other end of the second thin film transistor T2 and a cathode electrode that is connected to the second common power line CPL2 to which the common power voltage ELVSS is applied. The organic light emitting diode OLED that is included in the first pixel Px1 may emit red light.

The first thin film transistor T1 and the second thin film transistor T2 may be p-channel field effect transistors. In this case, a gate-on voltage, which turns on the first thin film transistor T1 and the second thin film transistor T2, is a logic low-level voltage, and a gate-off voltage, which turns off the first thin film transistor T1 and the second thin film transistor T2, is a logic high-level voltage.

Here, although an embodiment using the p-channel field effect transistor is described, at least one of the first thin film transistor T1 and the second thin film transistor T2 may be an n-channel field effect transistor, and in this case, the gate-on voltage, which turns on the n-channel field effect transistor, is a logic high-level voltage, and the gate-off voltage, which turns off the n-channel field effect transistor, is a logic low-level voltage.

Figure 3:
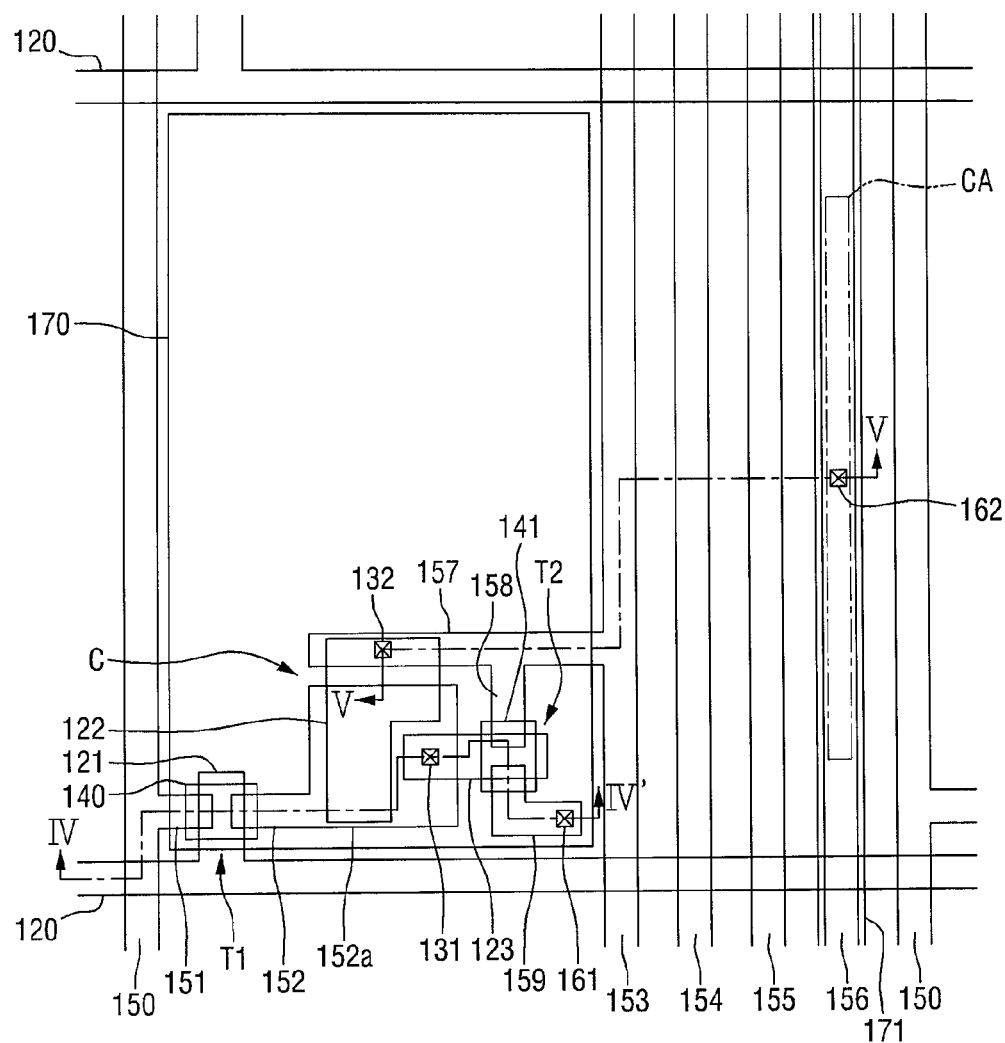
FIG. 3 is a plan view illustrating in more detail a portion III of FIG. 1.

Hereinafter, referring to FIGS. 3, 4, and 5, the detailed plan view and cross-sectional view of the display device according to an embodiment of the present invention will be described. FIG. 3 is a plan view illustrating in more detail a portion III of FIG. 1, FIG. 4 is a cross-sectional view taken along line IV-IV' of FIG. 3, and FIG. 5 is a cross-sectional view taken along line V-V' of FIG. 3.

Figure 4:
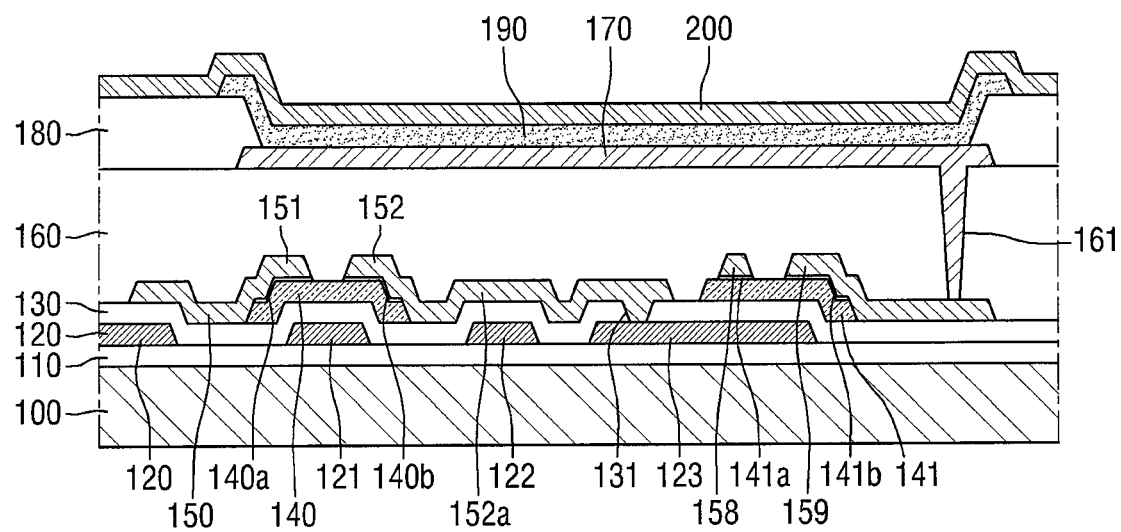
FIG. 4 is a cross-sectional view taken along line IV-IV' of FIG. 3.
Figure 5:
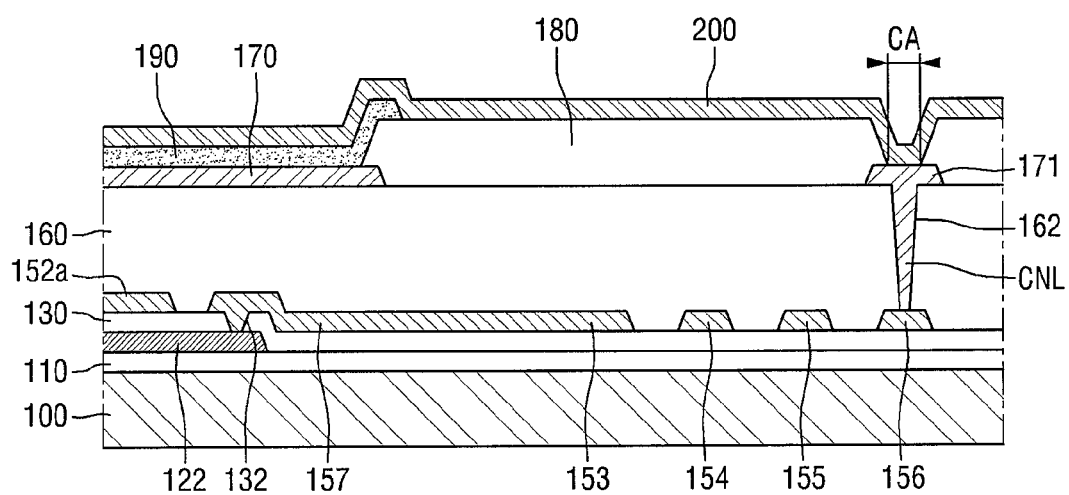
FIG. 5 is a cross-sectional view taken along line V-V' of FIG. 3.

FIGS. 3, 4, and 5 are views illustrating in more detail part III of FIG. 1, for example, the first pixel Px1. Because the structures of the second pixel Px2 and the third pixel Px3 are substantially the same as the structure of the first pixel Px1, the detailed description thereof will be omitted.

A substrate 100 may be an insulating substrate. The substrate 100 may be a rigid substrate, but is not limited thereto. For example, the substrate 100 may also be a flexible substrate. The substrate 100 may include the above-described display region DA, and all constituent elements illustrated in FIGS. 3, 4, and 5 may be positioned or located within the display region DA.

A buffer layer 110 may be positioned or located on the substrate 100. The buffer layer 110 may serve to prevent metal atoms and impurities from being diffused from the substrate 100. In one embodiment, the buffer layer 110 may be made of a silicon compound.

A gate line 120 may be positioned or located on the buffer layer 110. The gate line 120 may be formed to extend in the horizontal direction of the display region DA, for example, in the x-direction of FIG. 1. The gate line 120 may include metal, an alloy, metal nitride, conductive metal oxide, and a transparent conductive material. The gate line 120 may receive a gate signal applied from a gate driving unit and transfer the gate signal to a first gate electrode 121.

The first gate electrode 121 may be formed to extend from the gate line 120. Specifically, the first gate electrode 121 may be formed to project from the gate line 120 in a direction that is perpendicular to the direction in which the gate line 120 extends, for example, in the y direction of FIG. 1. The first gate electrode 121 may be made of the same material as the gate line 120. The first gate electrode 121 may receive the gate signal that is applied to the gate line 120.

A first capacitor electrode 122 may be formed to be spaced apart from the gate line 120 and the first gate electrode 121. The first capacitor electrode 122 may be made of the same material as the gate line 120. The first capacitor electrode 122 may be electrically connected to a first pixel power line 153 through a second contact hole 132 to be described later to receive the first pixel power voltage ELVDD1 applied thereto.

A second capacitor electrode 152a may be formed to be spaced apart from the gate line 120, the first gate electrode 121, and the first capacitor electrode 122. The second capacitor electrode 152a may be made of the same material as the gate line 120. The second capacitor electrode 152a may be electrically connected to a first drain electrode 152 through a first contact hole 131 to be described later.

The above-described gate line 120, the first gate electrode 121, the first capacitor electrode 122, and a second gate electrode 123 may be positioned or located on the same plane.

A gate insulating layer 130 may be positioned or located on the gate line 120, the first gate electrode 121, the first capacitor electrode 122, and the second gate electrode 123. The gate insulating layer 130 may be made of an insulating material. Further, the gate insulating layer 130 may have the first contact hole 131 that exposes a part of the second gate electrode 123 and connects the exposed part of the second gate electrode 123 to a second capacitor electrode 152a, and the second contact hole 132 that exposes a part of the first capacitor electrode 122 and connects the exposed part of the first capacitor electrode 122 to the first pixel power line 153 (e.g., the projection portion 157 of the first pixel power line).

A first semiconductor pattern 140 may be positioned or located on the gate insulating layer 130 that overlaps the first gate electrode 121. The first semiconductor pattern 140 may be made of amorphous semiconductor, microcrystalline semiconductor, polycrystalline semiconductor, or oxide semiconductor. A first source ohmic contact layer 140a that comes in contact with a first source electrode 151 and a first drain ohmic contact layer 140b that comes in contact with a first drain electrode 152 may be positioned or located on the first semiconductor pattern 140.

A second semiconductor pattern 141 may be positioned or located on the gate insulating layer 130 that overlaps the second gate electrode 123. The second semiconductor pattern 141 may be made of the same material as the first semiconductor pattern 140, but is not limited thereto. A second source ohmic contact layer 141a that comes in contact with a second source electrode 158 and a second drain ohmic contact layer 141b that comes in contact with a second drain electrode 159 may be positioned or located on the second semiconductor pattern 141.

The first semiconductor pattern 140 and the second semiconductor pattern 141 as described above may be positioned or located on the same plane.

A data line 150 may be positioned or located on the gate insulating layer 130. The data line 150 may be formed to extend in the vertical direction of the display region DA, for example, in the y direction of FIG. 1. The data line 150 may cross the gate line 120 to be insulated from the gate line 120 by the gate insulating layer 130. The data line 150 may include metal, an alloy, metal nitride, conductive metal oxide, or a transparent conductive material. The data line 150 may receive a data signal applied from a data driving unit and transfer the data signal to a first source electrode 151.

The first source electrode 151 may be formed to extend from the data line 150. In one embodiment, the first source electrode 151 may be formed to project from the data line 150 in a direction that is perpendicular to the direction in which the data line 150 extends, for example, in the x direction of FIG. 1. The first source electrode 151 may be positioned or located on one side of the first gate electrode 121 and the first semiconductor pattern 140. The first source electrode 151 may be made of the same material as the data line 150. The first source electrode 151 may receive the data signal that is applied to the data line 150.

The first drain electrode 152 may be formed in a position that faces the first source electrode 151. The first drain electrode 152 may be formed to be spaced apart from the first source electrode 151. Specifically, the first drain electrode 152 may be positioned or located on the other side of the first gate electrode 121 and the first semiconductor pattern 140. The first drain electrode 152 may be made of the same material as the data line 150. If the gate signal is in a turn-on state, the first drain electrode 152 may receive the data signal that is applied to the first source electrode 151 through the first semiconductor pattern 140. The first drain electrode 152 may form the first thin film transistor T1 together with the first gate electrode 121, the first semiconductor pattern 140, and the first source electrode 151.

A second capacitor electrode 152a may be formed to extend from the first drain electrode 152. For example, in order to form a holding capacitor C having a sufficient capacitance, the second capacitor electrode 152a may be formed through extension of the first drain electrode 152. The second capacitor electrode 152a may form the holding capacitor C together with the first capacitor electrode 122 as described above.

The first pixel power line 153 may be positioned or located on the gate insulating layer 130. The first pixel power line 153 may be formed to extend in the vertical direction of the display region DA, for example, in the y direction of FIG. 1. The first pixel power line 153 may cross the gate line 120 to be insulated from the gate line 120. The first pixel power line 153 may be made of the same material as the data line 150. The first pixel power line 153 may receive the first pixel power voltage ELVDD1 applied thereto.

A second pixel power line 154 may be positioned or located on the gate insulating layer 130. The second pixel power line 154 may be arranged in parallel to the first pixel power line 153. The second pixel power line 154 may be made of the same material as the data line 150. The second pixel power line 154 may receive the second pixel power voltage ELVDD2 applied thereto.

A third pixel power line 155 may be positioned or located on the gate insulating layer 130. The third pixel power line 155 may be arranged in parallel to the first pixel power line 153 and the second pixel power line 154. The third pixel power line 155 may be made of the same material as the data line 150. The third pixel power line 155 may receive the third pixel power voltage ELVDD3 applied thereto.

The first pixel power line 153, the second pixel power line 154, and the third pixel power line 155 may have different resistance values (or resistances). In one embodiment, the resistance values (or resistances) of the plurality of pixel power lines 153, 154, and 155, when arranged from largest resistance to smallest resistance, may have the order of the first pixel power line 153, the second pixel power line 154, and the third pixel power line 155. In general, the level of current that flows to the plurality of pixels Px1, Px2, and Px3, when arranged from lowest current to highest current, have the order of the first pixel Px1 that emits red light, the second pixel Px2 that emits green light, and the third pixel Px3 that emits blue light. Accordingly, in order to make the voltages applied to the plurality of pixels Px1, Px2, and Px3 constant (or substantially equal), the resistance value (or resistance) of the first pixel power line 153 that is connected to the first pixel Px1 may have the largest value, and the resistance value (or resistance) of the third pixel power line 155 may have the smallest value. Accordingly, the difference in luminance between the plurality of pixels Px1, Px2, and Px3 that emit light of different colors can be reduced.

A first common power line 156 may be positioned or located on the gate insulating layer 130. The first common power line 156 may be arranged in parallel to the first pixel power line 153, the second pixel power line 154, and the third pixel power line 155. The first common power line 156 may be made of the same material as the data line 150. The first common power line 156 may receive the common power voltage ELVSS applied thereto.

Because, according to one embodiment, the first common power line 156 is configured to apply a ground voltage to all the plurality of pixels Px1, Px2, and Px3, it may have a resistance value (or resistance) that is smaller than the resistance values (or resistances) of the first pixel power line 153, the second pixel power line 154, and the third pixel power line 155.

A projection portion 157 may be formed to extend from the first pixel power line 153. The projection portion 157 may extend to project in the horizontal direction (e.g., x direction) of the display region DA. The projection portion 157 may be made of the same material as the data line 150. An end portion of the projection portion 157 may be electrically connected to the first capacitor electrode 122 through the second contact hole 132.

The second source electrode 158 may be formed to extend from the projection portion 157. The second source electrode 158 may project in the vertical direction (e.g., the y direction) of the display region DA. The second source electrode 158 may be positioned or located on one side of the second gate electrode 123 and the second semiconductor pattern 141. The second source electrode 158 may be made of the same material as the data line 150. The second source electrode 158 may receive the first pixel power voltage ELVDD1 that is applied to the first pixel power line 153.

The second drain electrode 159 may be formed in a position that faces the second source electrode 158. The second drain electrode 159 may be formed to be spaced apart from the second source electrode 158. Specifically, the second drain electrode 159 may be positioned or located on the other side of the second gate electrode 123 and the second semiconductor pattern 141. The second drain electrode 159 may be made of the same material as the data line 150. The second drain electrode 159 may receive current that corresponds to the data signal applied to the second gate electrode 123 through the second source electrode 158 and the second semiconductor pattern 141. The second drain electrode 159 may form the second thin film transistor T2 together with the second gate electrode 123, the second semiconductor pattern 141, and the second source electrode 158.

The data line 150, the first source electrode 151, the first drain electrode 152, the second capacitor electrode 152a, the first pixel power line 153, the second pixel power line 154, the third pixel power line 155, the first common power line 156, the projection portion 157, the second source electrode 158, and the second drain electrode 159 may be positioned or located on the same plane.

A planarization layer 160 may be formed on the data line 150, the first source electrode 151, the first drain electrode 152, the second capacitor electrode 152a, the first pixel power line 153, the second pixel power line 154, the third pixel power line 155, the first common power line 156, the projection portion 157, the second source electrode 158, and the second drain electrode 159. The surface of the planarization layer 160 may be flat. The planarization layer 160 may be made of an insulating material. Further, the planarization layer 160 may include a third contact hole 161 that exposes a part of the second drain electrode 159 and a fourth contact hole 162 that exposes a part of the first common power line 156. In one embodiment, the fourth contact hole 162 is formed on the center line CL of the display region DA.

A first electrode 170 may be positioned or located on the planarization layer 160. Further, the first electrode 170 may be formed in a region that is surrounded by the gate line 120 and the data line 150. In one embodiment, the first electrode 170 may be surrounded by the gate line 120, the data line 150, and the first pixel power line 153, but embodiments of the present invention are not limited thereto. The first electrode 170 may be an anode electrode. In this case, the first electrode 170 may be made of a conductive material having high work function. The first electrode 170 may be electrically connected to the second drain electrode 159 through the third contact hole 161.

A second common power line 171 may be positioned or located on the planarization layer 160. The second common power line 171 may be electrically connected to the first common power line 156 through the fourth contact hole 162. Here, a conductive material that is positioned or located in the fourth contact hole 162 may be a connection line CNL that connects (or interconnects) the first common power line 156 and the second common power line 171 to each other. For example, the connection line CNL may be a part of the second common power line 171. The second common power line 171 may overlap the first common power line 156. Further, the second common power line 171 may be made of the same material as the first electrode 170. Further, the resistance value (or resistance) of the second common power line 171 may be substantially equal to the resistance value (or resistance) of the first common power line 156. The second common power line 171 may receive the common power voltage DLVSS from the first common power line 156.

The first electrode 170 and the second common power line 171 as described above may be positioned or located on the same plane.

A pixel-defining layer 180 may be positioned or located on the planarization layer 160. The pixel-defining layer 180 may be formed to expose the center portion of the first electrode 170 and a part of the second common power line 171. Here, a part of the exposed second common power line 171 may be a cathode contact region CA, for example, a region in which the second electrode 200 and the second common power line 171 come in contact with each other. The pixel-defining layer 180 may be made of an insulating material.

An organic light emitting layer 190 may be positioned or located on the first electrode 170 that is exposed by the pixel-defining layer 180. If current is applied to the organic light emitting layer 190, electrons and holes in the organic light emitting layer 190 are recombined to form excitons, and light of a specific wavelength is generated by energy from the formed excitons. Because FIGS. 3, 4, and 5 are related to the first pixel Px1, red light may be emitted from the organic light emitting layer 190 illustrated in FIGS. 3, 4, and 5.

The organic light emitting layer 190 may be made of a low molecular organic material or a high molecular organic material. The organic light emitting layer 190 may include a hole-injection layer (HIL), a hole-transporting layer (HTL), a hole blocking layer (HBL), an emitting layer (EML), an electron-transporting layer (ETL), an electron-injection layer (EIL), and an electron blocking layer (EBL).

A second electrode 200 may be positioned or located on the organic light emitting layer 190, the pixel-defining layer 180, and the second common power line 171. The second electrode 200 may be a cathode electrode. In this case, the second electrode 200 may be made of a conductive material having low work function. The second electrode 200 is connected to the second common power line 171 in the cathode contact region CA to receive the common power voltage ELVSS. As described above, each of the plurality of pixels Px1, Px2, and Px3 may have a substantially similar structure including the first electrode 170, the organic light emitting layer 190, and the second electrode 200.

Hereinafter, referring to FIGS. 1 and 6, 7, 8, and 9, a mechanism that reduces the difference in luminance between positions of the display apparatus according to an embodiment of the present invention will be described.

Figure 6:
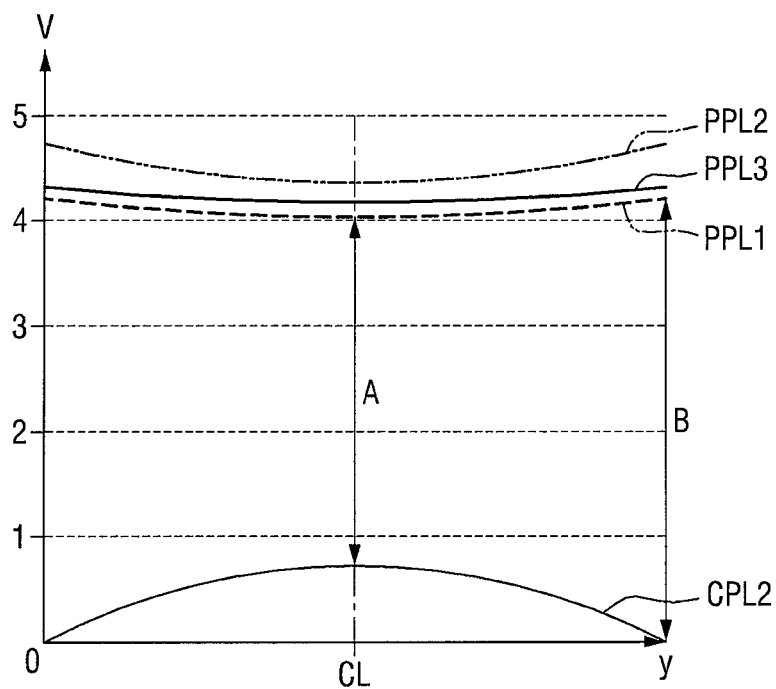
FIG. 6 is a graph illustrating first, second, and third pixel power voltages that are applied to first, second, and third pixel power lines arranged along a y direction and a common power voltage that is applied to a second common power line in the case where a first common power line is omitted and a common power voltage is supplied from both end portions of the second common power line in the display device of FIG. 1.
Figure 7:
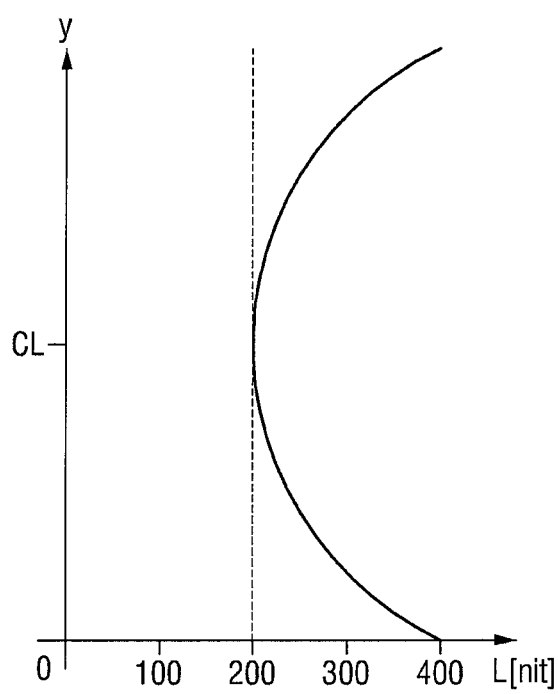
FIG. 7 is a graph illustrating luminance of a plurality of pixels arranged in the y direction in the case where a first common power line is omitted and a common power voltage is supplied from both end portions of a second common power line in the display device of FIG. 1.

First, FIGS. 1, 6, and 7 are referred to FIG. 6 is a graph illustrating first, second, and third pixel power voltages ELVDD1, ELVDD2, and ELVDD3 that are applied to first, second, and third pixel power lines PPL1, PPL2, and PPL3 according to the y direction and a common power voltage ELVSS that is applied to a second common power line CPL2 in the case where a first common power line CPL1 is omitted and a common power voltage ELVSS is supplied from both end portions of the second common power line CPL2 in the display device of FIG. 1. FIG. 7 is a graph illustrating luminance of a plurality of pixels Px1, Px2, and Px3 arranged in the y direction in the case where a first common power line CPL1 is omitted and a common power voltage ELVSS is supplied from both end portions of a second common power line CPL2 in the display device of FIG. 1.

Referring to FIGS. 1 and 6, if the first common power line CPL1 is omitted and the common power voltage ELVSS is supplied from the both end portions of the second common power line CPL2 in the display device of FIG. 1, current flows from the both end portions of the first, second, and third pixel power lines PPL1, PPL2, and PPL3, to which high voltage is applied, to the both end portions of the second common power line CPL2, to which low voltage, for example, ground voltage, is applied, in the display region DA. In this case, the current, which flows from the first, second, and third pixel power lines PPL1, PPL2, and PPL3 to the second common power line CPL2, passes through the plurality of pixels Px1, Px2, and Px3. When the current passes through the plurality of pixels Px1, Px2, and Px3, the plurality of pixels Px1, Px2, and Px3 emit light having luminance that corresponds to the voltage difference between the both ends thereof.

However, due to wire resistance or the like, a voltage drop occurs along a current flow path. Accordingly, the first, second, and third pixel power voltages ELVDD1, ELVDD2, and ELVDD3 that are applied to the first, second, and third pixel power lines PPL1, PPL2, and PPL3 decrease from the edge portion to the center portion of the display region DA, and the common power voltage ELVSS that is applied to the second common power line CPL2 is decreased as going from the center portion to the edge portion of the display region DA. Such a voltage drop may be intensified in a large-size display device.

In this case, the voltage difference A between both ends of a pixel that is positioned or located in the center portion of the display region DA, for example, in the portion of the center line CL, is smaller than the voltage difference B between both ends of a pixel that is positioned or located in the edge portion of the display region DA. In this case, as illustrated in FIG. 7, the luminance of the center portion of the display region DA becomes lower than the luminance of the edge portion of the display region DA, and such luminance imbalance phenomenon deteriorates the display quality of the display device.

Figure 8:
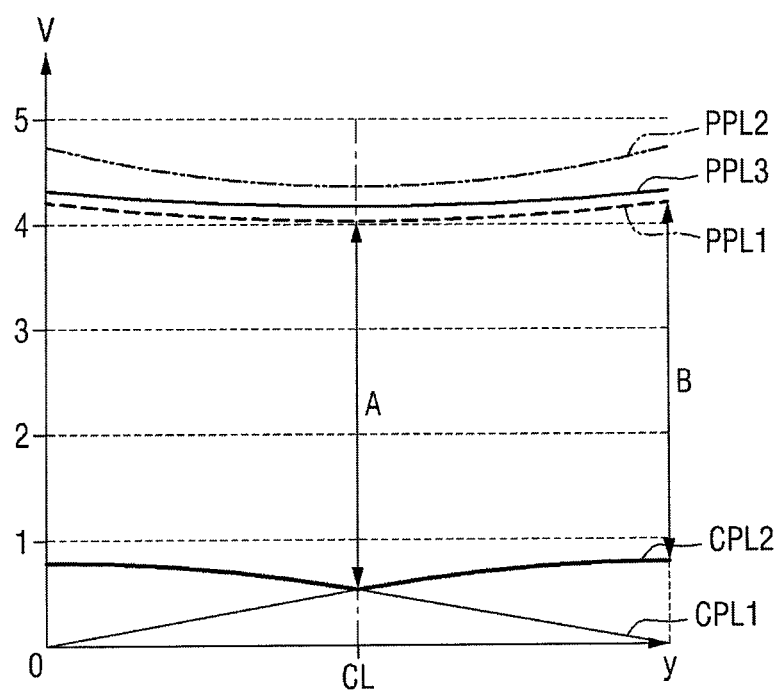
FIG. 8 is a graph illustrating first, second, and third pixel power voltages that are applied to first, second, and third pixel power lines arranged along the y direction and a common power voltage that is applied to first and second common power lines in the display device of FIG. 1.
Figure 9:
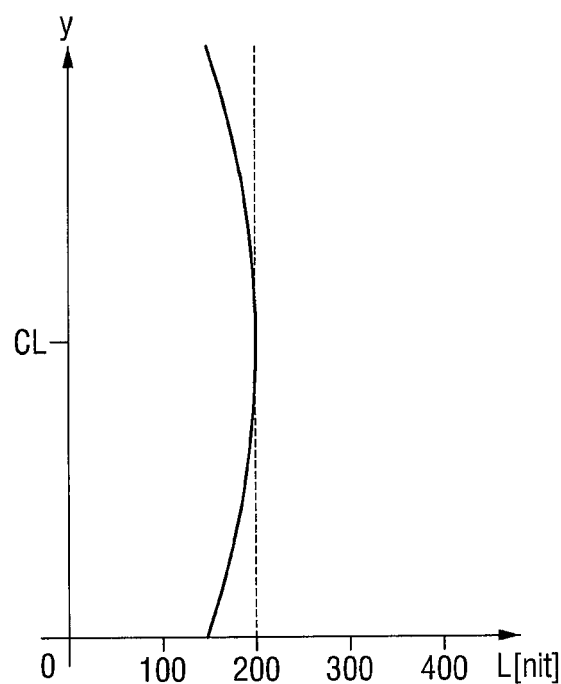
FIG. 9 is a graph illustrating luminance of a plurality of pixels arranged in the y direction in the display device of FIG. 1.

In contrast, the display device according to an embodiment of the present invention can reduce or minimize the luminance imbalance. This feature will be described in more detail with reference to FIGS. 1, 8, and 9. FIG. 8 is a graph illustrating first, second, and third pixel power voltages ELVDD1, ELVDD2, and ELVDD3 that are applied to first, second, and third pixel power lines PPL1, PPL2, and PPL3 according to the y direction and a common power voltage ELVSS that is applied to first and second common power lines CPL1 and CPL2 in the display device of FIG. 1. FIG. 9 is a graph illustrating luminance of a plurality of pixels Px1, Px2, and Px3 arranged in the y direction in the display device of FIG. 1.

Referring to FIGS. 1 and 8, current flows from the both end portions of the first, second, and third pixel power lines PPL1, PPL2, and PPL3, to which high voltage is applied, to the both end portions of the first common power line CPL1, to which low voltage, for example, ground voltage, is applied, in the display region DA. In this case, the current, which flows from the first, second, and third pixel power lines PPL1, PPL2, and PPL3 to the first common power line CPL1, passes through the plurality of pixels Px1, Px2, and Px3, the second common power line CPL2, and the connection line CNL.

On the other hand, even in display devices according to embodiments of the present invention, due to wire resistance or the like, a voltage drop occurs along a current flow path. Accordingly, the first, second, and third pixel power voltages ELVDD1, ELVDD2, and ELVDD3 that are applied to the first, second, and third pixel power lines PPL1, PPL2, and PPL3 decrease from the edge portion to the center portion of the display region DA as shown in FIG. 6. However, because the current that is transferred to the second common power line CPL2 flows from the edge portion of the display region DA to the direction of the center portion, for example, to the direction in which the connection line CNL is located, the common power voltage ELVSS that is applied to the second common power line CPL2 also decreases from the edge portion to the center portion of the display region DA. On the other hand, because the current that has passed through the connection line CNL flows from the center portion to the edge portion of the display region DA, the common power voltage ELVSS that is applied to the first common power line CPL1 decreases from the center portion to the edge portion of the display region DA. In this case, because the voltage drop that occurs on the first common power line CPL1 is only related to the wire resistance, the common power voltage ELVSS that is applied to the first common power line CPL1 linearly decreases.

In this case, the voltage difference A between both ends of a pixel that is positioned or located in the center portion of the display region DA, for example, in the portion of the center line CL, becomes similar to the voltage difference B between both ends of a pixel that is positioned or located in the edge portion of the display region DA. In this case, as illustrated in FIG. 9, if the luminance in the center portion of the display region DA is intentionally set to be slightly higher than the luminance in the edge portion of the display region DA, a user of the display device can view the displayed image with higher quality (e.g., with more even luminance).

According to the display device according to an embodiment of the present invention as described above, the first common power line 156 is separately installed, and thus the luminance imbalance between the upper and lower portions and the center portion of the display region DA can be decreased. Further, by forming the first common power line 156 and the second common power line 171 on the different layers and connecting the lines through the contact hole, the aperture ratio of the display device can remain substantially the same. Further, if the first common power line 156 is formed concurrently or simultaneously with the data line 150 and the second common power line 171 is formed concurrently or simultaneously with the first electrode 170, there is no need to increase the number of masks used in the manufacturing process. In other words, separate masks for forming the first common power line 156 are unnecessary in order to manufacture embodiments of the present invention.

Hereinafter, a method for manufacturing a display device according to an embodiment of the present invention will be described with reference to FIGS. 10, 11, 12, 13, 14, 15, 16, 17, 18, 19, 20, 21, and 22. FIGS. 10, 11, 12, 13, 14, 15, 16, 17, 18, 19, 20, 21, and 22 are cross-sectional views explaining a method for manufacturing the display device of FIG. 1 by processing steps.

Figure 10:
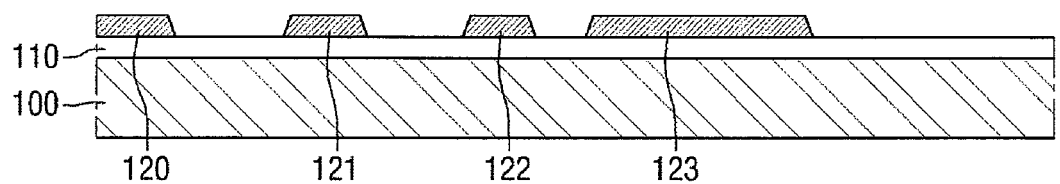
FIGS. 10, 11, 12, 13, 14, 15, 16, 17, 18, 19, 20, 21 and 22 are cross-sectional views explaining a method for manufacturing the display device of FIG. 1 by processing steps according to one embodiment of the present invention.
Figure 11:
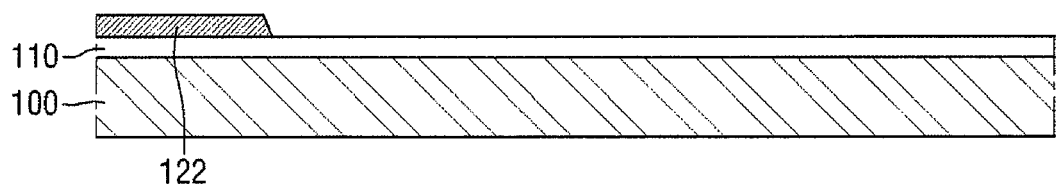

First, referring to FIGS. 10 and 11, a buffer layer 110 is formed on a substrate 100. Then, a gate line 120, a first gate electrode 121, a first capacitor electrode 122, and a second gate electrode 123 are concurrently or simultaneously formed on the buffer layer 110.

Figure 12:
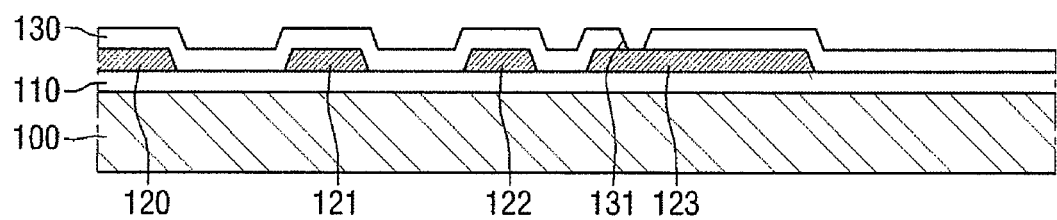
Figure 13:
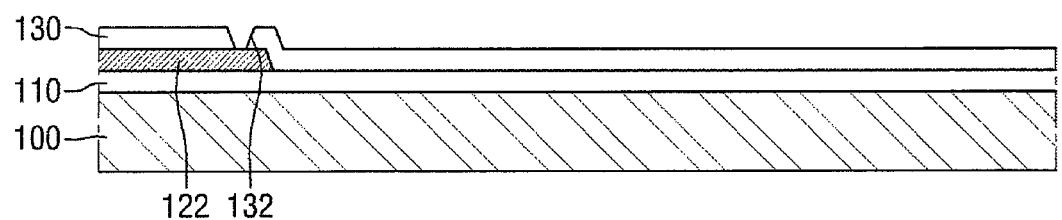

Next, referring to FIGS. 12 and 13, a gate insulating layer 130 is formed on the gate line 120, the first gate electrode 121, the first capacitor electrode 122, and the second gate electrode 123. In this case, a first contact hole 131 and a second contact hole 132 are formed on the gate insulating layer 130.

Figure 14:
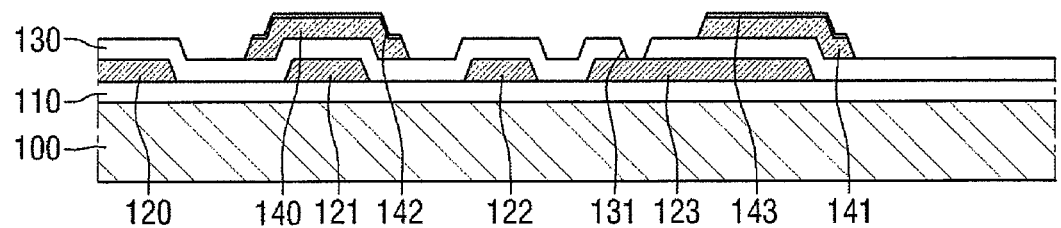

Next, referring to FIG. 14, a first semiconductor pattern 140 and a second semiconductor pattern 141 are formed on the gate insulating layer 130. Thereafter, a first preliminary ohmic contact layer 142 and a second preliminary ohmic contact layer 143 are formed on the first semiconductor pattern 140 and the second semiconductor pattern 141, respectively.

Figure 15:
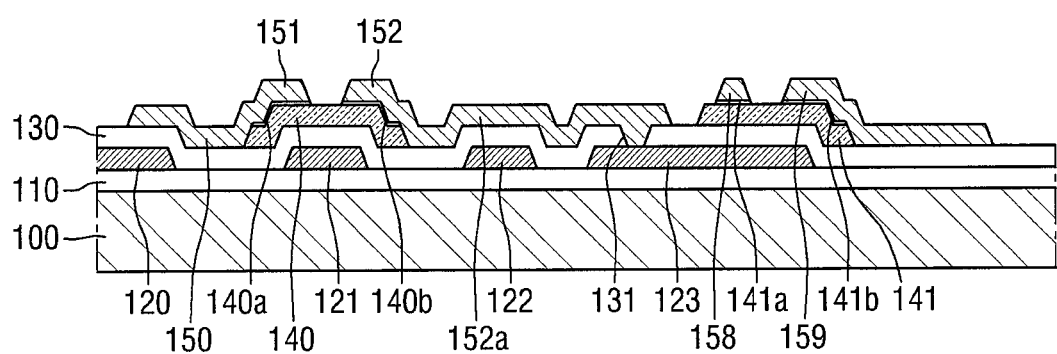
Figure 16:
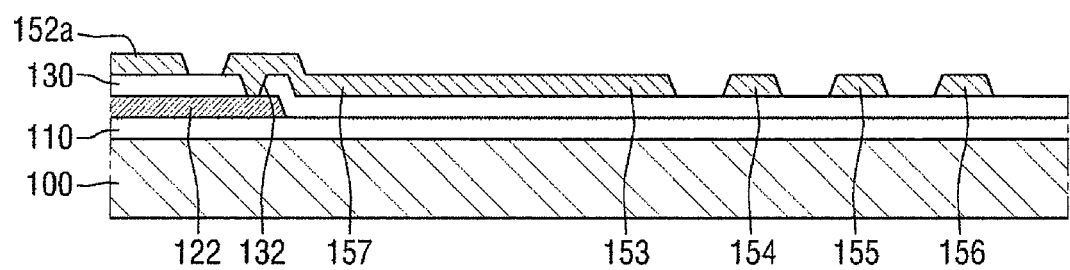

Next, referring to FIGS. 15 and 16, a data line 150, a first source electrode 151, a first drain electrode 152, first, second, and third pixel power lines 153, 154, and 155, a first common power line 156, a projection portion 157, a second source electrode 158, and a second drain electrode 159 are formed on the gate insulating layer 130. In this case, the first preliminary ohmic contact layer 142 is patterned into a first source ohmic contact layer 140a and a first drain ohmic contact layer 140b, and the second preliminary ohmic contact layer 143 is patterned into a second source ohmic contact layer 141a and a second drain ohmic contact layer 141b.

Figure 17:
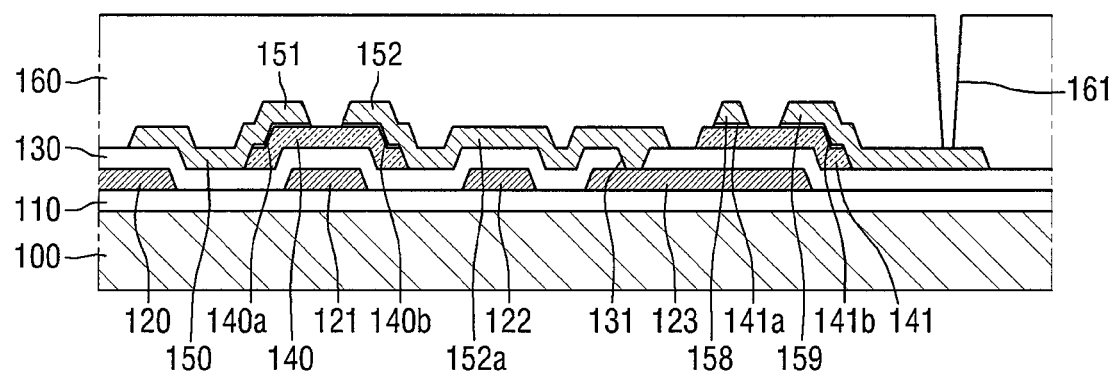
Figure 18:
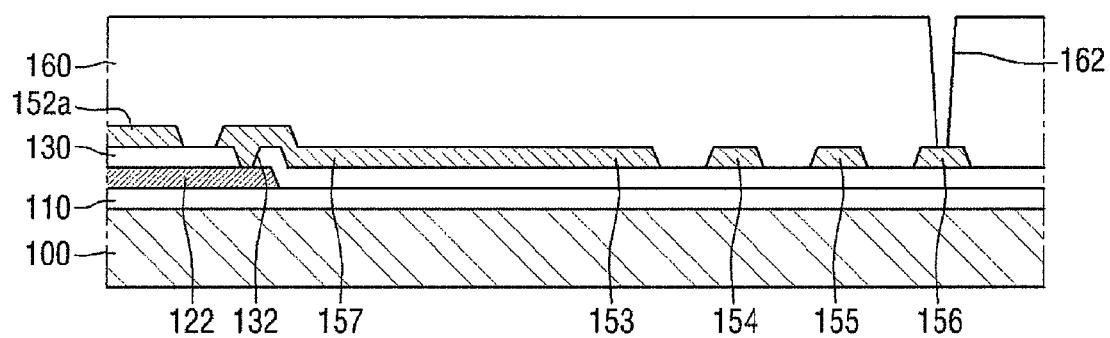

Next, referring to FIGS. 17 and 18, a planarization layer 160 is formed on the data line 150, the first source electrode 151, the first drain electrode 152, the first, second, and third pixel power lines 153, 154, and 155, the first common power line 156, the projection portion 157, the second source electrode 158, and the second drain electrode 159. In this case, a third contact hole 161 and a fourth contact hole 162 are formed on the planarization layer 160.

Figure 19:
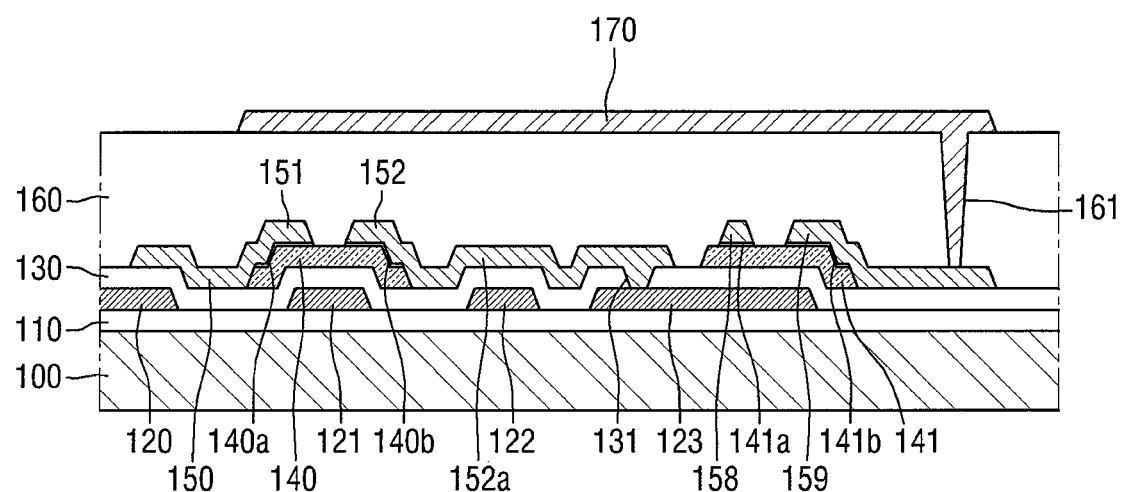
Figure 20:
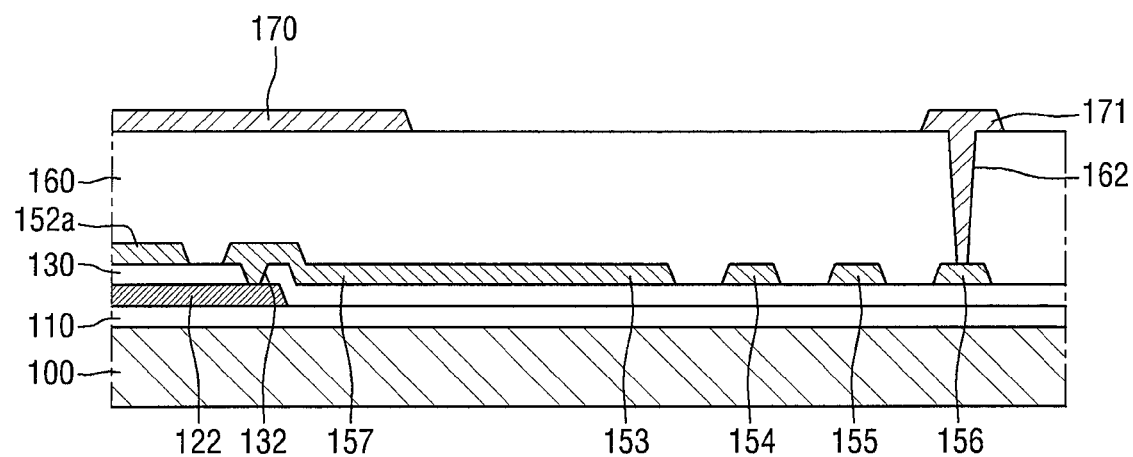

Next, referring to FIGS. 19 and 20, a first electrode 170 and a second common power line 171 are formed on the planarization layer 160. The first electrode 170 and the second common power line 171 may fill the third contact hole 161 and the fourth contact hole 162, respectively. In this case, a part of the second common power line 171 that fills the fourth contact hole 162 may be a connection line CNL.

Figure 21:
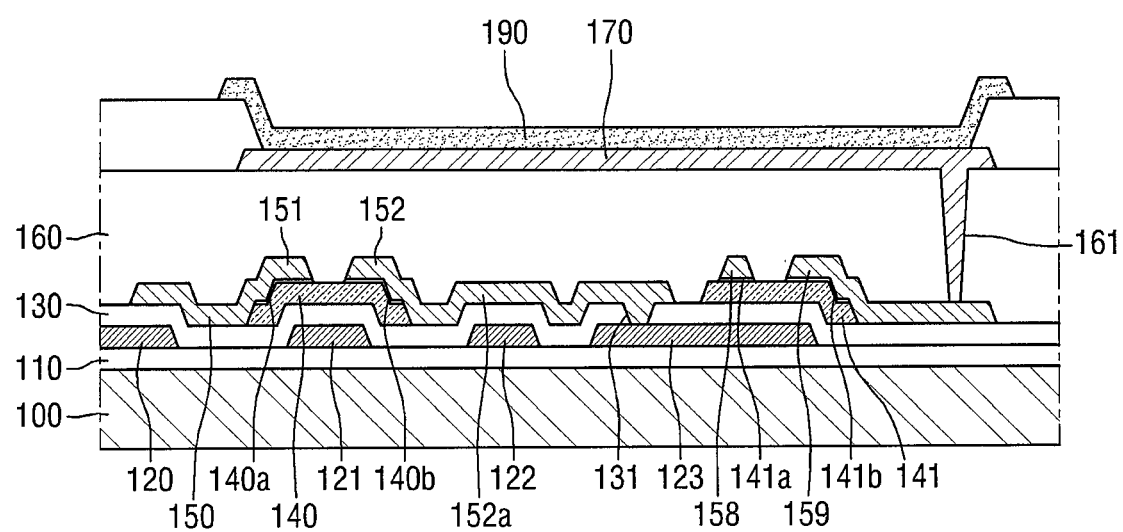
Figure 22:
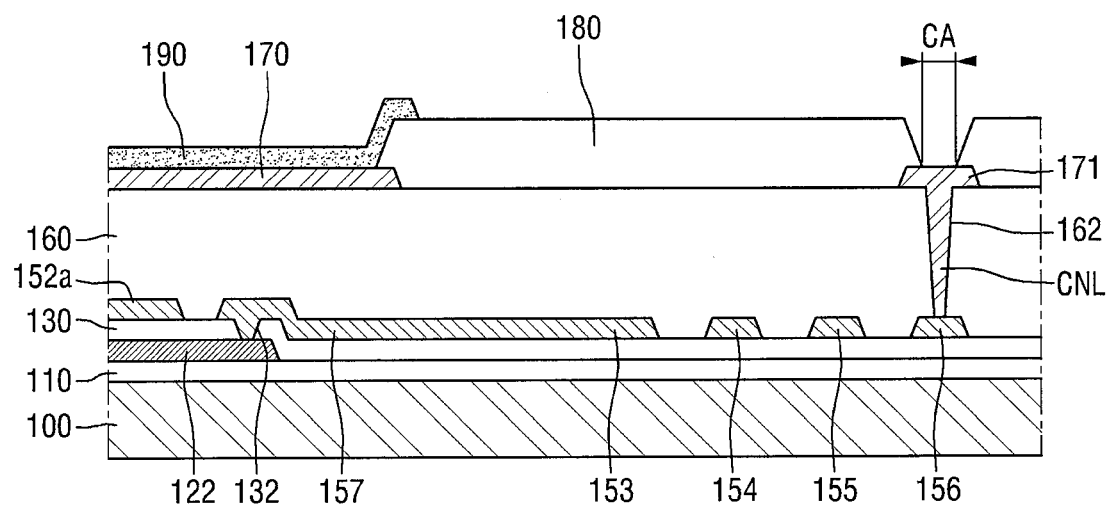

Next, referring to FIGS. 21 and 22, a pixel-defining layer 180 is formed on the planarization layer 160. Thereafter, an organic light emitting layer 190 is formed on the first electrode 170.

By forming a second electrode 200 after the steps illustrated in FIGS. 21 and 22, the display device according to an embodiment of the present invention as illustrated in FIGS. 4 and 5 can be manufactured.

Figure 23:
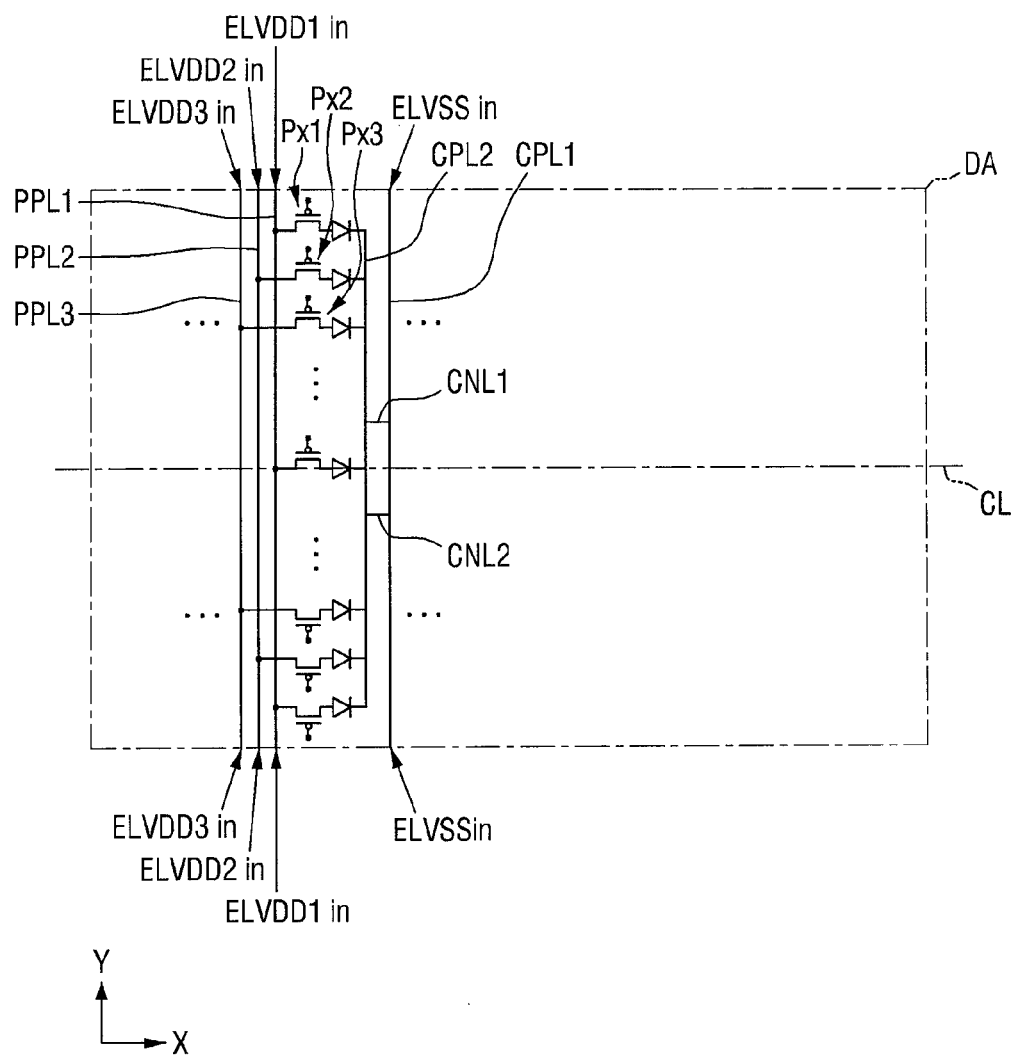
FIG. 23 is a schematic plan view of a display device according to another embodiment of the present invention.

FIG. 23 is a schematic plan view of a display device according to another embodiment of the present invention. For the sake of convenience in explanation, the same reference numerals are used for substantially the same elements as the elements illustrated in FIG. 1, and the duplicate description thereof will be omitted.

Referring to FIG. 23, a plurality of connection lines CNL1 and CNL2 may be provided to connect one first common power line CPL1 and one second common power line CPL2 to each other. The plurality of connection lines CNL1 and CNL2 may not be arranged on the center line CL, but may be arranged (e.g., symmetrically arranged) about the center line CL. In one embodiment, the plurality of connection lines CNL1 and CNL2 may include the first connection line CNL1 and the second connection line CNL2, the first connection line CNL1 may be arranged adjacent to the center line CL on the upper portion of the center line CL, and the second connection line CNL2 may be arranged adjacent to the center line CL on the lower portion of the center line CL. By adjusting the number and position of the connection lines CNL1 and CNL2, the luminance uniformity in the display region DA can be adjusted more smoothly.

Figure 24:
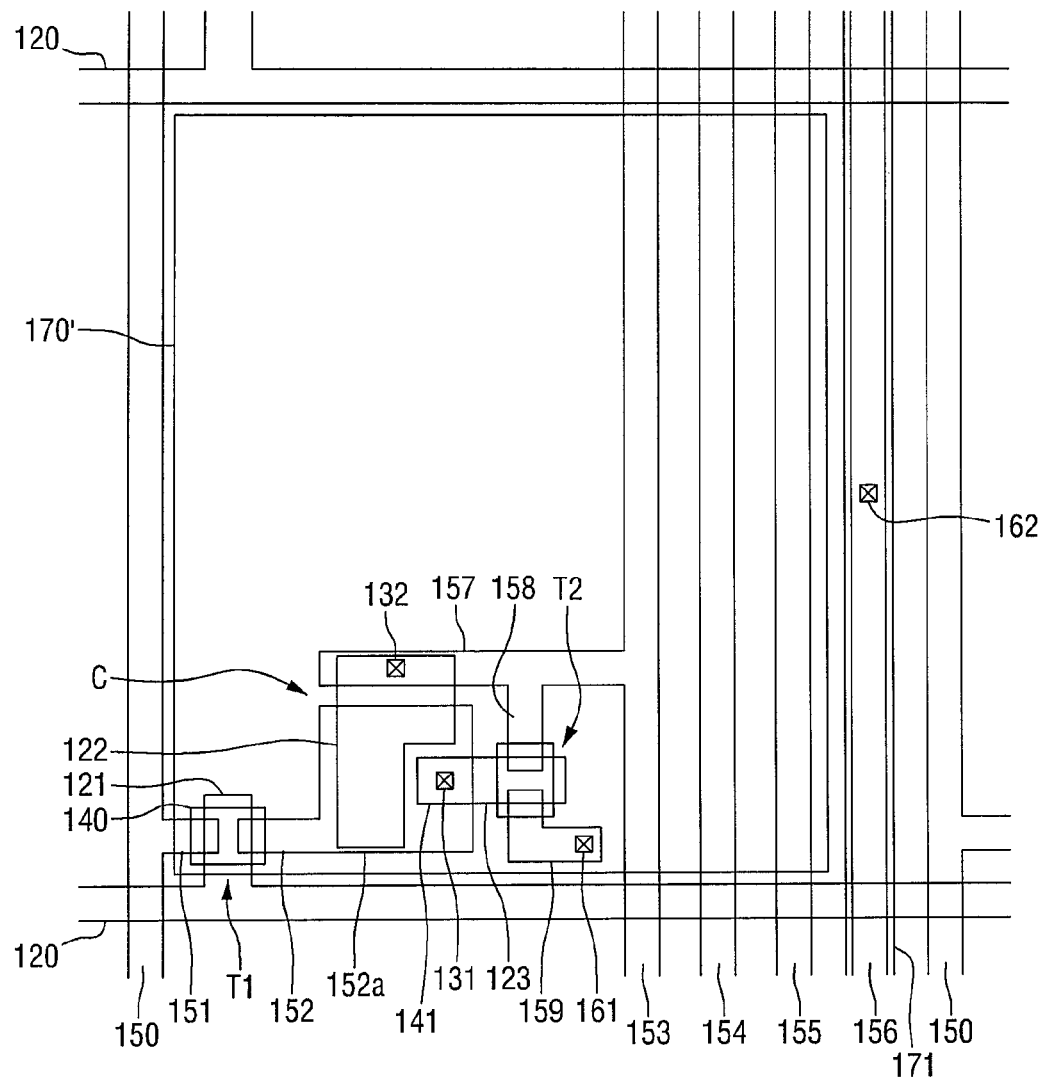
FIG. 24 is a plan view illustrating in more detail a display device according to still another embodiment of the present invention.

FIG. 24 is a plan view illustrating in more detail a display device according to still another embodiment of the present invention. For the sake of convenience in explanation, the same reference numerals are used for substantially the same elements as the elements illustrated in FIG. 3, and the duplicate description thereof will be omitted.

Referring to FIG. 24, one side of a first electrode 170' may overlap first, second, and third pixel power lines 153, 154, and 155. In other words, the first electrode 170' may be surrounded by a gate line 120, a data line 150, and a first common power line 156. By increasing the area of the first electrode 170', the aperture ratio of the display device can be improved.

Figure 25:
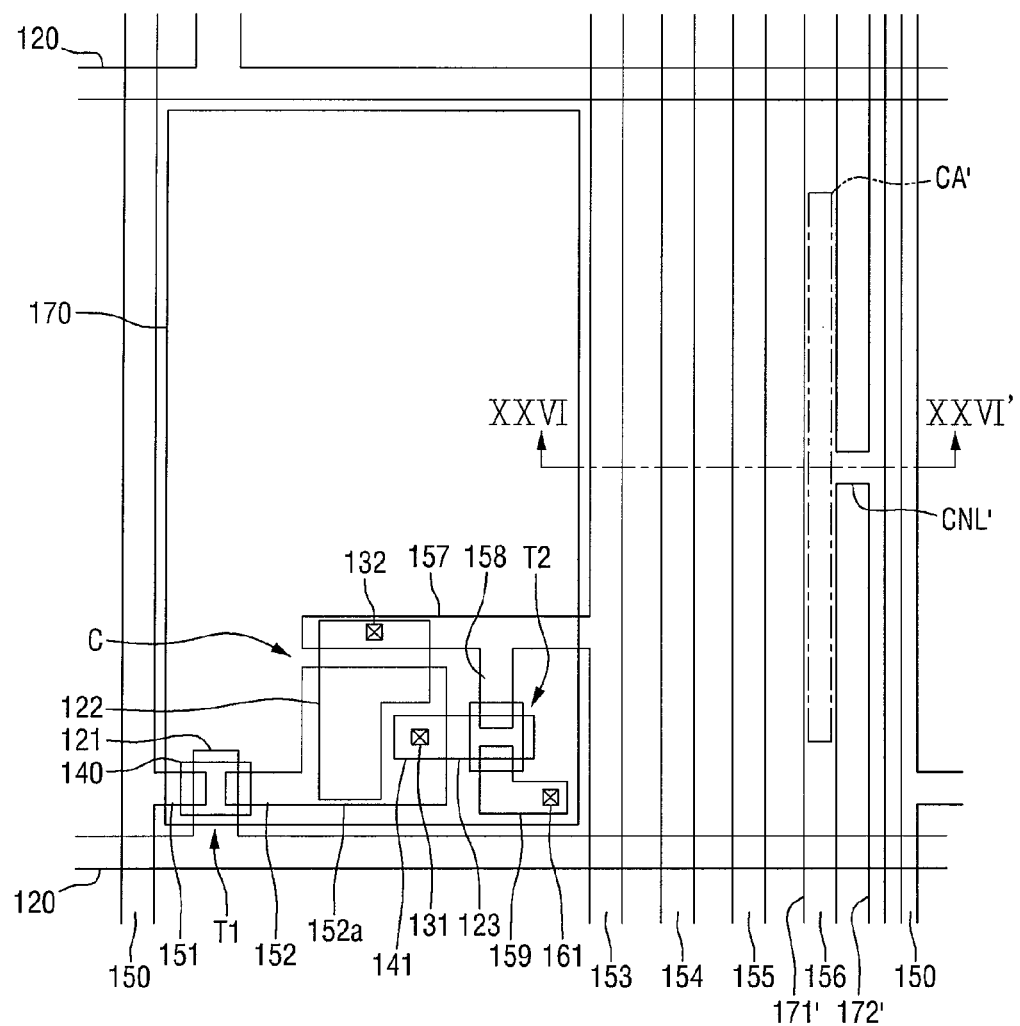
FIG. 25 is a plan view illustrating in more detail a display device according to still another embodiment of the present invention.
Figure 26:
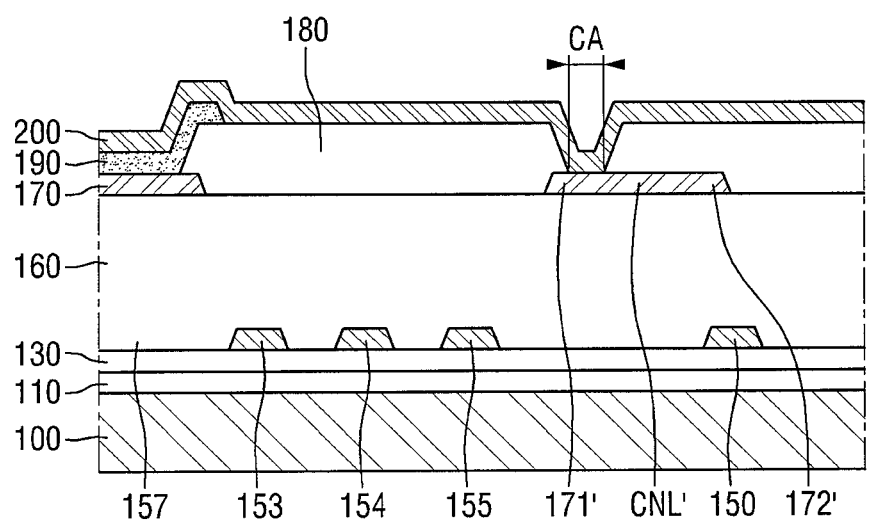
FIG. 26 is a cross-sectional view taken along line XXVI-XXVI' of FIG. 25.

FIG. 25 is a plan view illustrating in more detail a display device according to still another embodiment of the present invention, and FIG. 26 is a cross-sectional view taken along line XXVI-XXVI' of FIG. 25. For the sake of convenience in explanation, the same reference numerals are used for substantially the same elements as the elements illustrated in FIGS. 3, 4, and 5, and the duplicate description thereof will be omitted.

Referring to FIGS. 25 and 26, a first common power line 172' and a second common power line 171' may be arranged on the same plane. In one embodiment, the first common power line 172' and the second common power line 171' may be arranged on the same layer as a first electrode 170, but embodiments of the present invention are not limited thereto. The first common power line 172' and the second common power line 171' may be arranged on the same layer as a data line 150. In this case, a connection line CNL' may be not arranged in a contact hole, but instead may be arranged on the same plane as the first common power line 172' and the second common power line 171'. In this case, a cathode contact region CA' may be formed only on the second common power line 171', and not formed on the first common power line 172'. Further, in order to reduce or minimize the reduction of the aperture ratio of the display device, at least a part of the first common power line 172' may overlap the data line 150. In the above-described structure, a plurality of pixel power lines 153, 154, and 155 and the plurality of common power lines 171' and 172' are concurrently formed on the same plane, and thus the circuit design can be simplified.

Although embodiments of the present invention have been described for illustrative purposes, those skilled in the art will appreciate that various modifications, additions and substitutions are possible, without departing from the scope and spirit of the invention as disclosed in the accompanying claims.

What is claimed is:
1. A display device comprising:
a substrate having a display region in which an image is configured to be displayed;

a plurality of pixels on the display region of the substrate; and a plurality of common power lines on the display region of the substrate and configured to supply a common power voltage to the plurality of pixels, the plurality of common power lines including first and second common power lines extending along a first direction, the second common power line being connected to the plurality of pixels arranged along the first direction, and the first and second common power lines being electrically connected to each other in a central portion of the display region.

2. The display device of claim 1, wherein the common power voltage is supplied from both end portions of the first common power line.

3. The display device of claim 1, wherein the plurality of pixels are in a matrix form, and the first and second common power lines extend in a row or a column direction of the matrix.

4. The display device of claim 1, wherein each of the plurality of pixels comprises a first electrode, an organic light emitting layer, and a second electrode, which are successively laminated, and the second common power line contacts the second electrode.

5. The display device of claim 4, further comprising:

a thin film transistor comprising a drain electrode, the drain electrode being connected to the first electrode; and an insulating layer between the first electrode and the drain electrode, wherein the first common power line is on the same plane as the drain electrode, and the second common power line is on the same plane as the first electrode.

6. The display device of claim 5, wherein the first and second common power lines overlap.

7. The display device of claim 4, wherein the first and second common power lines are on the same plane as the first electrode.

8. The display device of claim 4, further comprising a connection line connecting the first and second common power lines, wherein the connection line is located on a virtual line that interconnects center points of the first and second common power lines to each other.

9. The display device of claim 4, further comprising a plurality of connection lines interconnecting the first and second common power lines to each other, wherein the plurality of connection lines are symmetrically located about a virtual line that connects center points of the first and second common power lines.

10. The display device of claim 1, wherein the plurality of pixels comprise first, second, and third pixels that are configured to emit light of different colors.

11. The display device of claim 10, further comprising a plurality of pixel power lines on the display region of the substrate, the plurality of pixel power lines being configured to supply first, second, and third pixel power voltages to the plurality of pixels, the first, second, and third pixel power voltages being different from the common power voltage, wherein a first pixel power line of the pixel power lines supplies the first pixel power voltage to the first pixel, a second pixel power line of the pixel power lines supplies the second pixel power voltage to the second pixel, and a third pixel power line of the pixel power lines supplies the third pixel power voltage to the third pixel.

12. The display device of claim 11, wherein the first pixel power voltage is supplied from both end portions of the first pixel power line, the second pixel power voltage is supplied from both end portions of the second pixel power line, and the third pixel power voltage is supplied from both end portions of the third pixel power line.

13. The display device of claim 11, wherein resistances of the plurality of common power lines are smaller than resistances of the plurality of pixel power lines.

14. The display device of claim 11, wherein the first, second, and third pixels are configured to emit red light, green light, and blue light, a resistance of the first pixel power line is larger than a resistance of the second pixel power line, and a resistance of the second pixel power line is larger than a resistance of the third pixel power line.

15. A display device comprising:

a substrate having a display region in which an image is configured to be displayed;

a plurality of pixels on the display region of the substrate; and a plurality of common power lines on the display region of the substrate and configured to supply a common power voltage to the plurality of pixels, the plurality of common power lines including first and second common power lines that are adjacent to each other, the first and second common power lines being electrically connected in a central portion of the display region, the plurality of common power lines extending between a first edge portion and a second edge portion of the display region, and wherein a voltage of the second common power line decreases along the direction from the first edge portion of the display region toward the central portion of the display region and the voltage of the second common power line decreases along the direction from the second edge portion of the display region toward the central portion of the display region.

16. The display device of claim 15, further comprising a plurality of pixel power lines on the display region of the substrate, the plurality of pixel power lines being configured to supply a plurality of pixel power voltages to the plurality of pixels, the plurality of pixel power voltages being different from the common power voltage, wherein the plurality of pixel power lines comprises at least one pixel power line coupled to a pixel of the plurality of pixels, the pixel being coupled to the first and second common power lines, and wherein a voltage difference between the at least one pixel power line and the second common power line is substantially constant in the display region.

17. The display device of claim 16, wherein the common power voltage is supplied from both end portions of the first common power line, and wherein the pixel power voltage is supplied from both end portions of the at least one pixel power line.

18. A method for manufacturing a display device, the method comprising:

forming a first common power line on a substrate;

forming a planarization layer that exposes a central portion of the first common power line; and forming a second common power line on the planarization layer, the second common power line overlapping a first electrode and the first common power line, the second common power line being electrically connected to the first common power line at the exposed central portion of the first common power line.

19. The method of claim 18, further comprising:

forming an organic light emitting layer on the first electrode after forming the first electrode and the second common power line; and forming a second electrode on the organic light emitting layer.

20. The method of claim 19, wherein the second electrode directly contacts the second common power line.

* * * * *